(12) United States Patent
Luo

(10) Patent No.: US 11,545,638 B2
(45) Date of Patent: Jan. 3, 2023

(54) ORGANIC COMPOUND AND MANUFACTURING METHOD THEREOF, AND ORGANIC LIGHT EMITTING DIODE ELECTROLUMINESCENT DEVICE

(71) Applicant: WUHAN CHINA STAR OPTOELECTRONICS SEMICONDUCTOR DISPLAY TECHNOLOGY CO., LTD., Hubei (CN)

(72) Inventor: Jiajia Luo, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 366 days.

(21) Appl. No.: 16/753,843

(22) PCT Filed: Mar. 2, 2020

(86) PCT No.: PCT/CN2020/077435
§ 371 (c)(1),
(2) Date: Apr. 6, 2020

(87) PCT Pub. No.: WO2020/244259
PCT Pub. Date: Dec. 10, 2020

(65) Prior Publication Data
US 2021/0020853 A1   Jan. 21, 2021

(30) Foreign Application Priority Data
Jun. 4, 2019 (CN) .......................... 201910481980.4

(51) Int. Cl.
*H01L 51/52* (2006.01)
*H01L 51/54* (2006.01)
(Continued)

(52) U.S. Cl.
CPC .......... *H01L 51/0094* (2013.01); *B01J 23/44* (2013.01); *H01L 51/0061* (2013.01);
(Continued)

(58) Field of Classification Search
CPC ............ H01L 51/0094; H01L 51/0061; H01L 51/0069; H01L 51/0071; H01L 51/0072; H01L 51/5056; B01J 23/44; C07F 7/10
See application file for complete search history.

(56) References Cited

U.S. PATENT DOCUMENTS 7,318,966 B2 * 1/2008 Tominaga ............. C07F 7/0814
556/415
10,505,128 B2 * 12/2019 Chung ................ H01L 51/0071
(Continued)

FOREIGN PATENT DOCUMENTS

CN   1397148 A   2/2003
CN   104471022 A   3/2015
(Continued)

OTHER PUBLICATIONS

Written Opinion in International Application PCT/CN2020/077435; dated Dec. 7, 2021 (Year: 2021).*
(Continued)

*Primary Examiner* — Mary A Wilczewski
(74) *Attorney, Agent, or Firm* — Mark M. Friedman

(57) ABSTRACT

An organic compound and a manufacturing method thereof, and an organic light emitting diode electroluminescent device are provided. The organic compound has a suitable HOMO energy level and a high hole mobility. Compared with traditional hole transport materials, when the organic compound is applied in a hole transport layer of the organic light emitting diode electroluminescent device, the organic light emitting diode electroluminescent device has enhanced
(Continued)

maximum current efficiency, maximum external quantum efficiency, and service lifespans.

14 Claims, 1 Drawing Sheet

(51) Int. Cl.
*H01L 51/56* (2006.01)
*B01J 23/44* (2006.01)
*H01L 51/00* (2006.01)
*H01L 51/50* (2006.01)
*C07F 7/10* (2006.01)

(52) U.S. Cl.
CPC ...... *H01L 51/0069* (2013.01); *H01L 51/0071* (2013.01); *H01L 51/0072* (2013.01); *C07F 7/10* (2013.01); *H01L 51/5056* (2013.01)

(56) References Cited

U.S. PATENT DOCUMENTS

| | | | | |
|---|---|---|---|---|
| 10,566,547 | B2* | 2/2020 | Zeng | ............ C09K 11/06 |
| 2004/0209115 | A1 | 10/2004 | Thompson et al. | |
| 2014/0353617 | A1 | 12/2014 | Kim et al. | |
| 2016/0035986 | A1* | 2/2016 | Chung | ............ H01L 51/0072 546/15 |
| 2016/0155961 | A1 | 6/2016 | Ueno et al. | |
| 2017/0342318 | A1 | 11/2017 | Kim et al. | |
| 2019/0088884 | A1* | 3/2019 | Aspuru-Guzik | ........ C09B 57/00 |
| 2019/0363263 | A1 | 11/2019 | Uno | |
| 2021/0020853 | A1* | 1/2021 | Luo | .................... H01L 51/0072 |

FOREIGN PATENT DOCUMENTS

| | | | | |
|---|---|---|---|---|
| CN | 106432317 | A | | 2/2017 |
| CN | 107004776 | A | | 8/2017 |
| CN | 107586307 | A | | 1/2018 |
| CN | 105884830 | | * 6/2018 | ............ H01L 51/50 |
| CN | 109574925 | A | | 4/2019 |
| CN | 110204567 | A | | 9/2019 |
| CN | 110540545 | A | | 12/2019 |
| JP | 2003-96072 | | * 4/2003 | ........... C07D 311/96 |
| JP | 2003096072 | A | | 4/2003 |
| KR | 20140020208 | A | | 2/2014 |
| KR | 20180127906 | A | | 11/2018 |
| WO | WO-2014072320 | A1 | * 5/2014 | ............ C07F 7/0812 |
| WO | WO-2020244259 | A1 | * 12/2020 | ............ B01J 23/44 |
| WO | WO 2021/103058 | | * 6/2021 | ............ H01L 51/54 |
| WO | WO 2021/103060 | | * 6/2021 | ............ H01L 51/50 |

OTHER PUBLICATIONS

International Search Report for International Application PCT/CN2020/077435, dated May 26, 2020 (Year: 2020).*

* cited by examiner

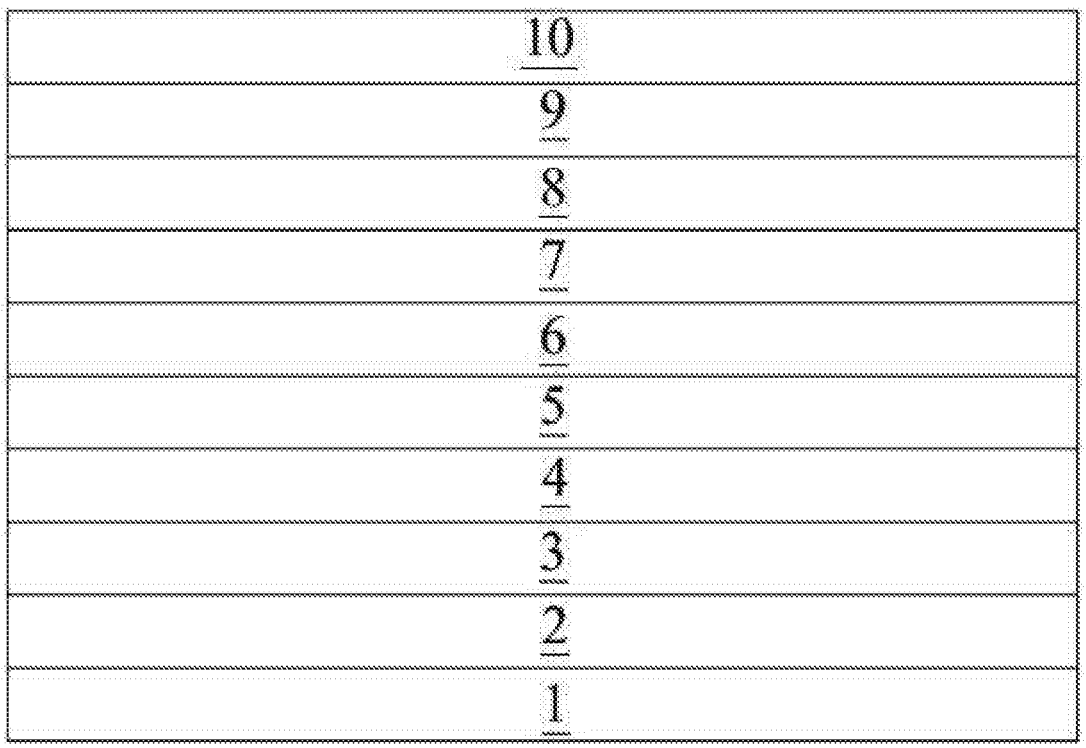

ORGANIC COMPOUND AND MANUFACTURING METHOD THEREOF, AND ORGANIC LIGHT EMITTING DIODE ELECTROLUMINESCENT DEVICE

FIELD OF DISCLOSURE

The present application relates to the technical field of organic electroluminescence, and particularly relates to an organic compound and a manufacturing method thereof, and an organic light emitting diode electroluminescent device.

BACKGROUND OF DISCLOSURE

Organic light emitting diodes (OLEDs) have great application prospects because of their advantages of active illumination without a backlight, high luminous efficiency, large viewing angles, fast response times, a wide temperature adaptation range, relatively simple production and processing technology, low driving voltages, low energy consumption, lightness and thinness, and flexible display, etc., which attract the attention of many researchers.

For currently used top-emitting OLED devices, a hole transport material is used as the thickest layer. There is always a contradiction between the energy level and the hole mobility. Particularly, the highest occupied molecular orbital (HOMO) energy level of the hole transport material with a high hole mobility does not match the material on both sides thereof, and the mismatch of the energy level may increase the driving voltage of the OLED devices.

Thus, it is necessary to provide a hole transport compound with high mobility and energy level matching.

SUMMARY OF DISCLOSURE

Technical Problems

The purpose of the present application is to provide an organic compound and a manufacturing method thereof, and an organic light emitting diode electroluminescent device. The organic compound has a suitable HOMO energy level and a high hole mobility. When the organic compound is applied to the organic light emitting diode electroluminescent device, the organic light emitting diode electroluminescent device has enhanced maximum current efficiency, maximum external quantum efficiency, and service lifespans.

Technical Solutions

An organic compound comprises a structure represented by a general formula (A) as follows,

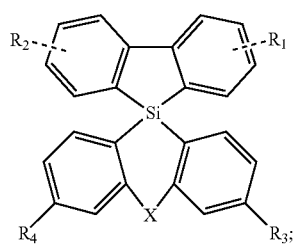

(A)

wherein $R_1$ is a first electron-donating group, $R_2$ is a second electron-donating group, H, phenyl, or alkyl, $R_3$ is H or $C(CH_3)_3$, $R_4$ is H or $C(CH_3)_3$, X is O or S, and the first electron-donating group and the second electron-donating group each independently have one of structures as follows,

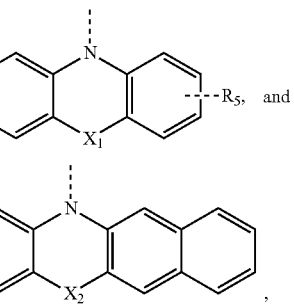

wherein $R_5$ and $R_6$ are each independently selected from one of H, phenyl, and alkyl, $X_1$ is selected from one of absent, single bond, O, S, isopropyl, and $Si(CH_3)_2$, and $X_2$ is selected from one of absent, single bond, O, S, isopropyl, and $Si(CH_3)_2$.

In the above organic compound, the first electron-donating group and the second electron-donating group each independently have a structure represented by one of formulas as follows,

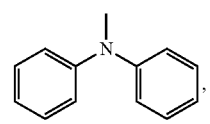

1

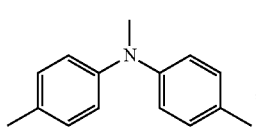

2

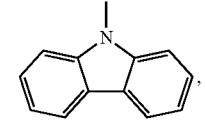

3

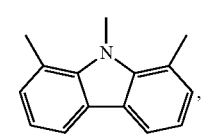

4

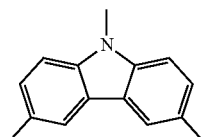

5

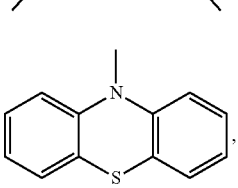

6

-continued
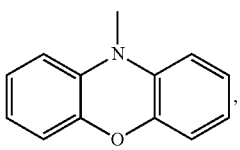
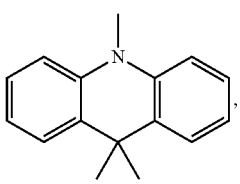
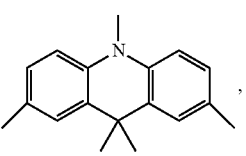
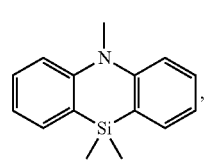
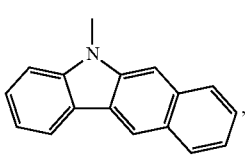
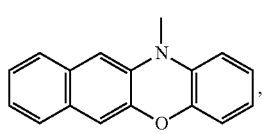
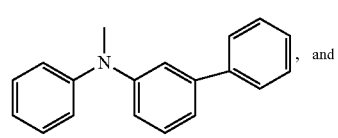, and
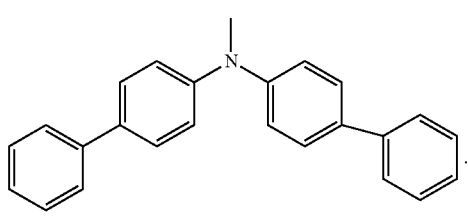.
In the above organic compound, the organic compound has a structure selected from one of the following structures,
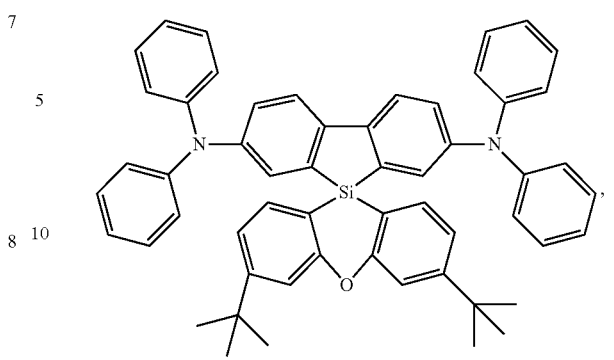
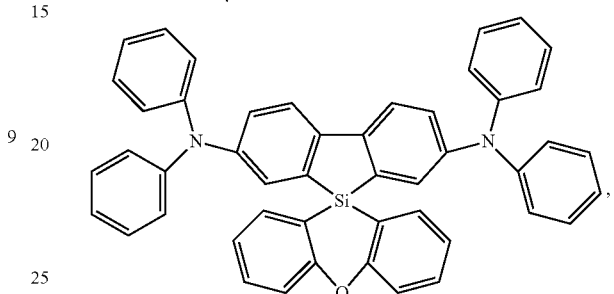
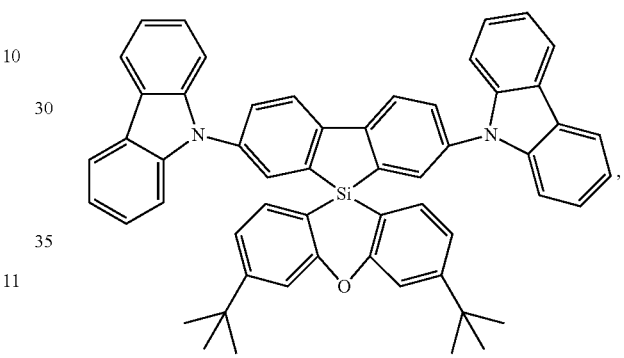
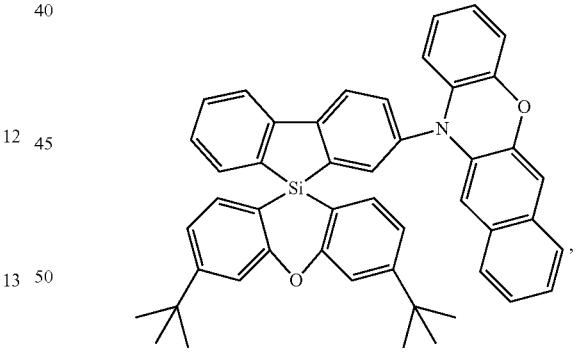
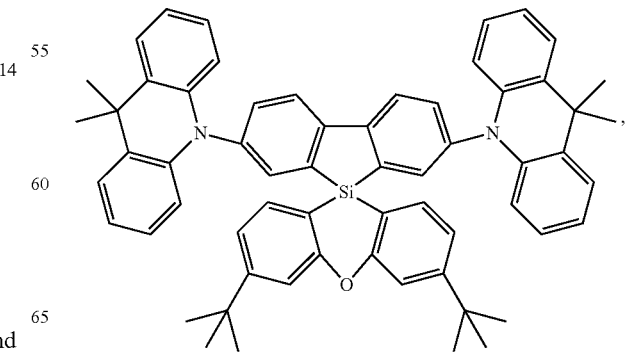

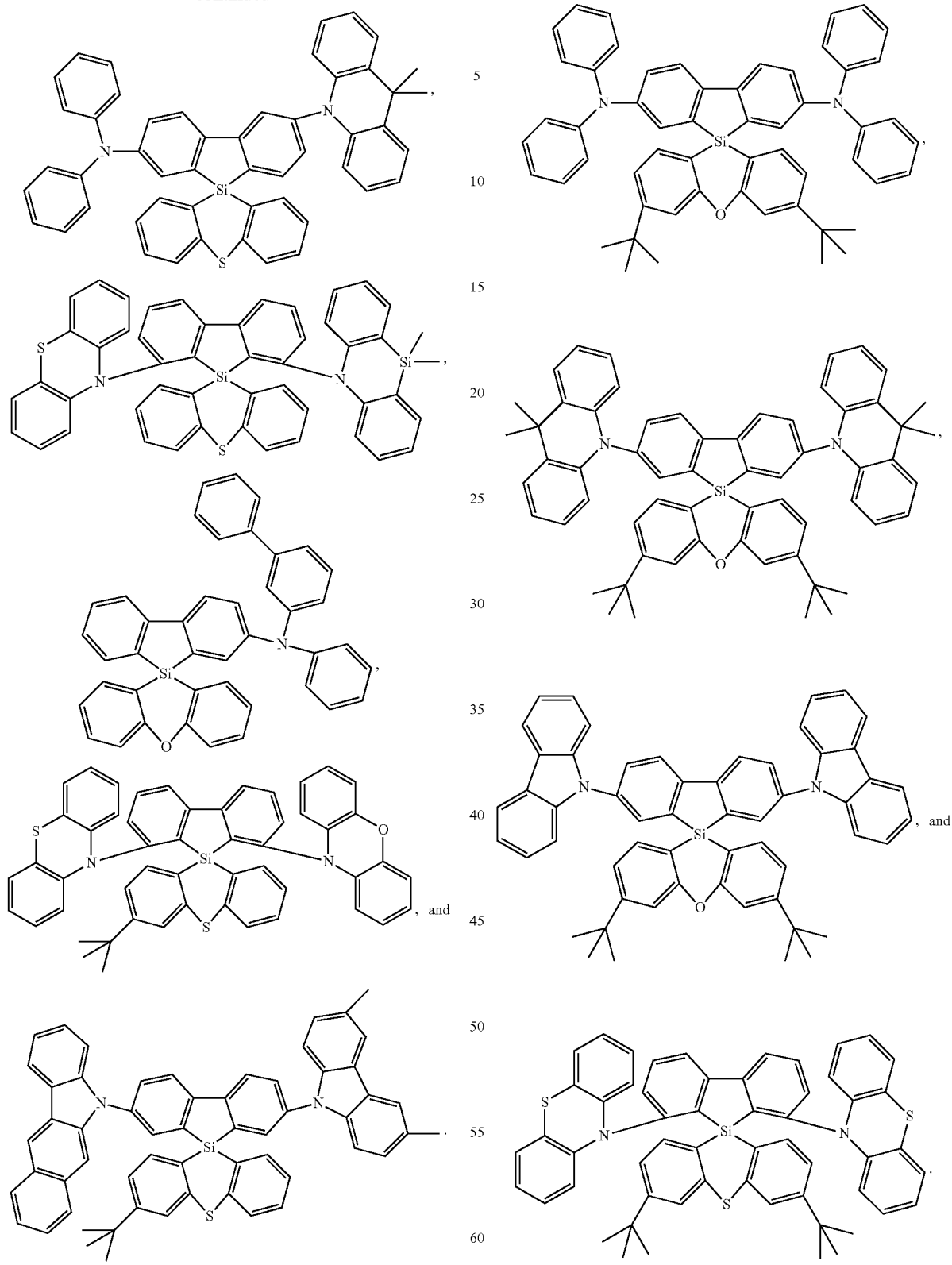

In the above organic compound, the $R_3$ and the $R_4$ are tert-butyl.

In the above organic compound, the organic compound has a structure selected from one of the following structures, In the above organic compound, the X is O.

An organic light emitting diode electroluminescent device comprises a hole transport layer which comprises an organic compound, wherein the organic compound has a structure represented by a general formula (A) as follows,

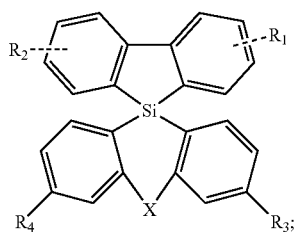

(A)

wherein $R_1$ is a first electron-donating group, $R_2$ is a second electron-donating group, H, phenyl, or alkyl, $R_3$ is H or $C(CH_3)_3$, $R_4$ is H or $C(CH_3)_3$, X is O or S, and the first electron-donating group and the second electron-donating group each independently have one of structures as follows,

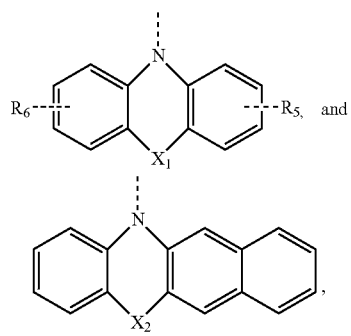

wherein $R_5$ and $R_6$ are each independently selected from one of H, phenyl, and alkyl, $X_1$ is selected from one of absent, single bond, O, S, isopropyl, and $Si(CH_3)_2$, and $X_2$ is selected from one of absent, single bond, O, S, isopropyl, and $Si(CH_3)_2$.

In the organic light emitting diode electroluminescent device, the first electron-donating group and the second electron-donating group each independently have a structure represented by one of formulas as follows,

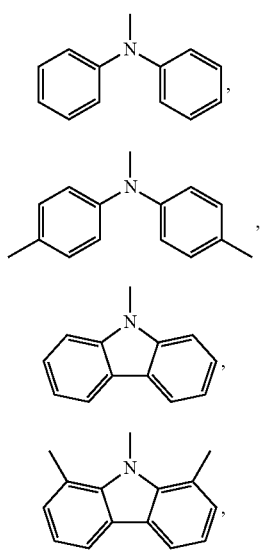

-continued

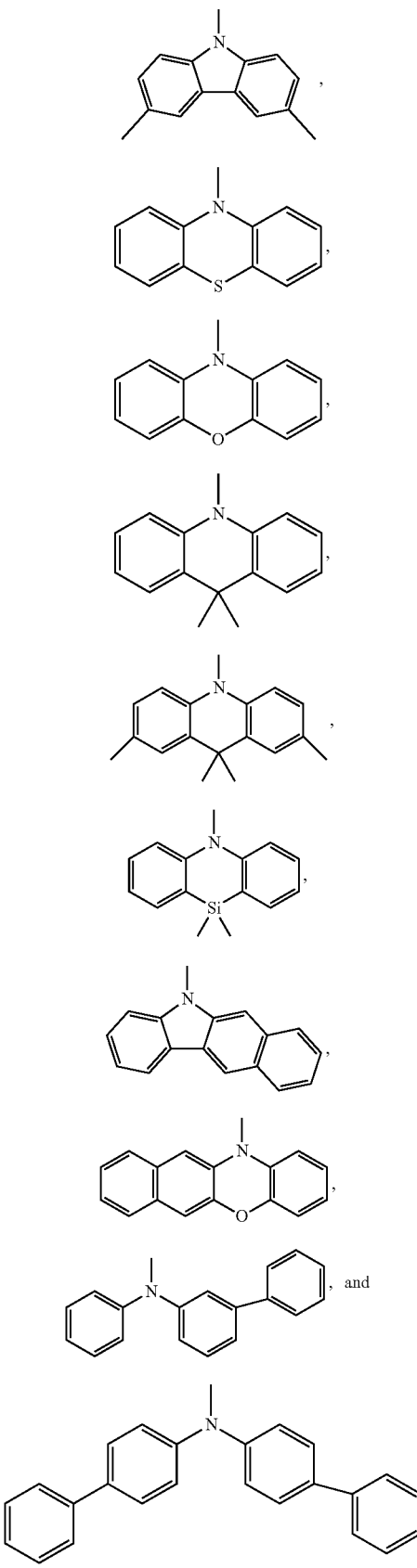

In the organic light emitting diode electroluminescent device, the organic compound has a structure selected from one of the following structures,
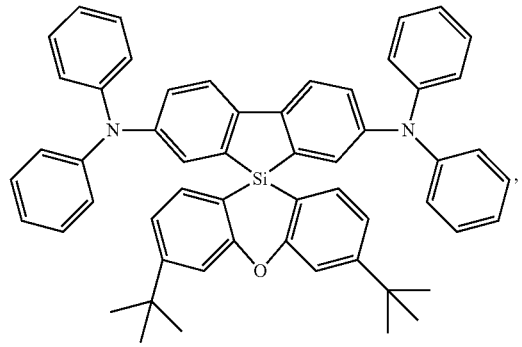
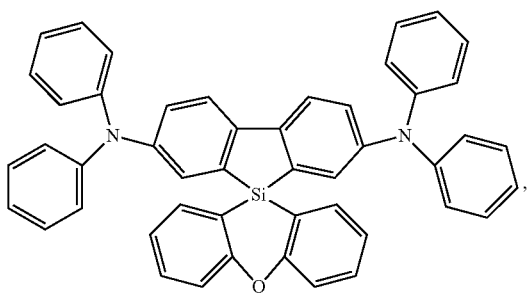
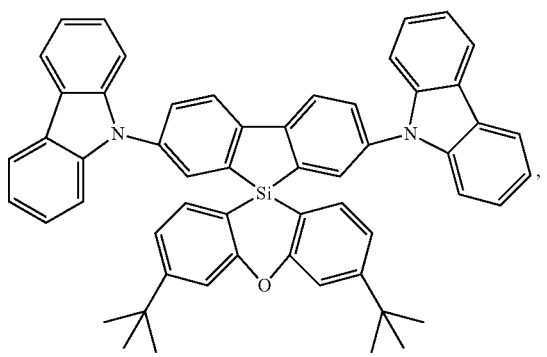
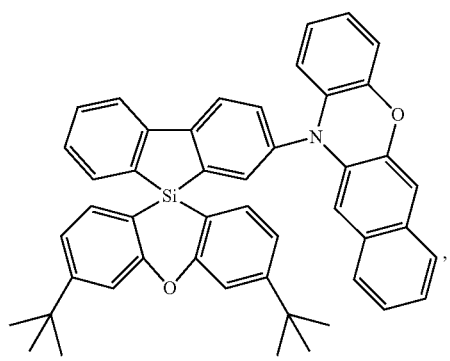
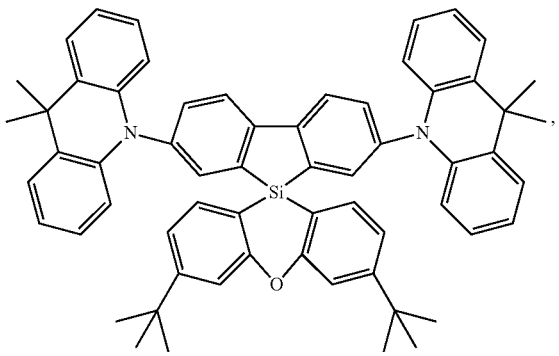
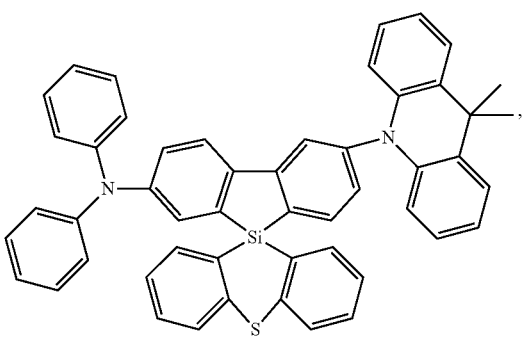
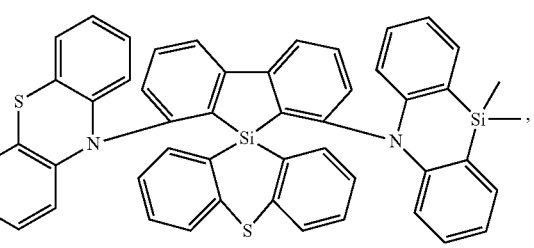
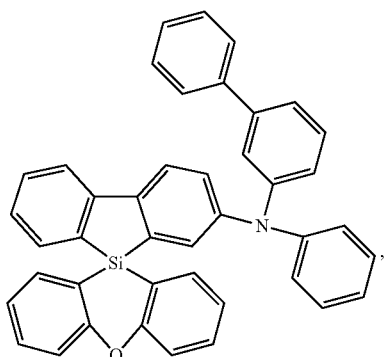
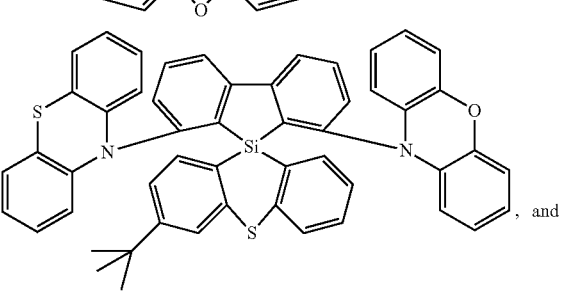, and -continued

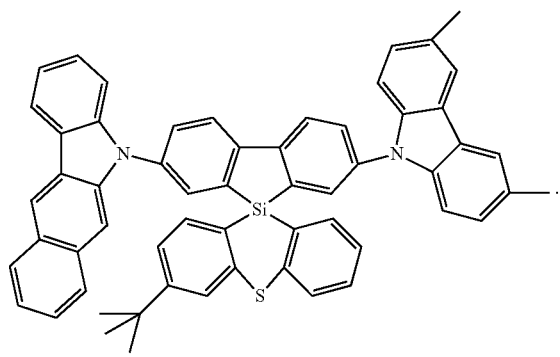 [SMILES: Cc1ccc2c(c1)c1cc(C)ccc1n2-c1ccc2c(c1)[Si]1(c3ccccc3Sc3cc(C(C)(C)C)ccc31)c1cc(-n3c4ccccc4c4cc5ccccc5cc43)ccc1-2 ; "."]

In the organic light emitting diode electroluminescent device, the $R_3$ and the $R_4$ are tert-butyl.

In the organic light emitting diode electroluminescent device, the organic compound has a structure selected from one of the following structures,

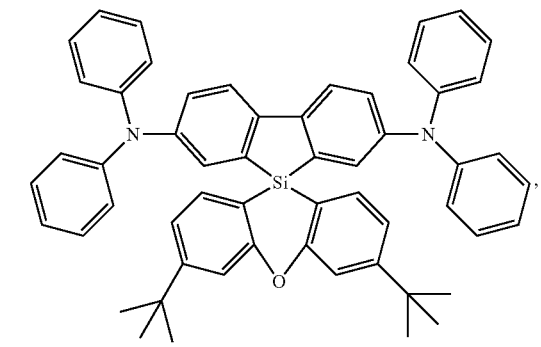

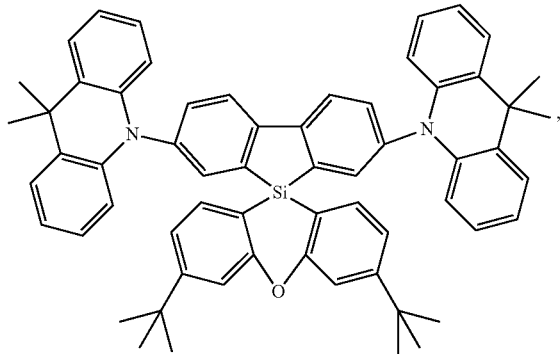

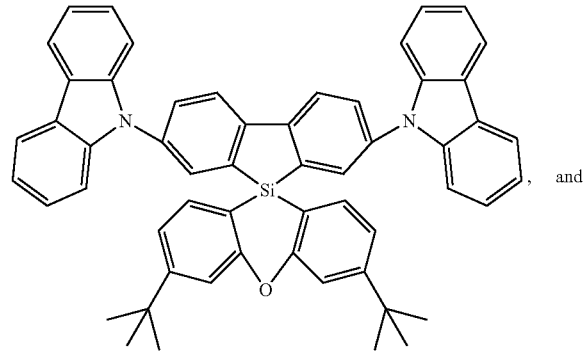, and

-continued

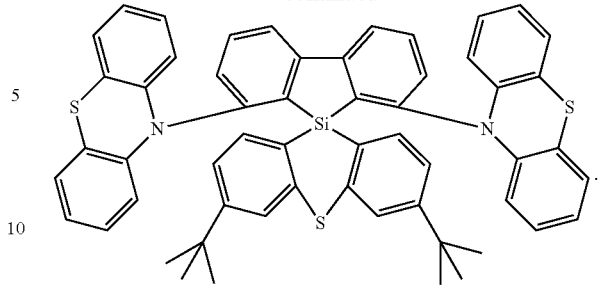

In the organic light emitting diode electroluminescent device, the X is O.

A manufacturing method of an organic compound comprises steps of:

an organic compound B, an organic compound C, a palladium catalyst, tri-tert-butylphosphine tetrafluoroborate, and alkali are added into an organic solvent under anhydrous and anaerobic conditions to obtain a mixture;

the mixture is reacted at a temperature of 110° C. to 130° C. for 20 h to 28 h, then cooled, extracted, separated, and purified to obtain the organic compound, wherein a structure of the organic compound B is as follows,

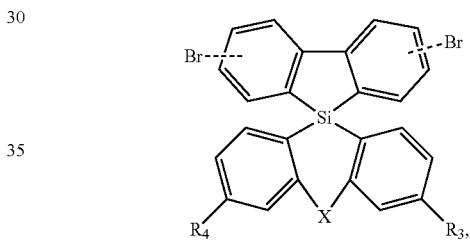

$R_3$ is H or $C(CH_3)_3$, $R_4$ is H or $C(CH_3)_3$, X is O or S, the organic compound C is selected from at least one of the structures shown as follows,

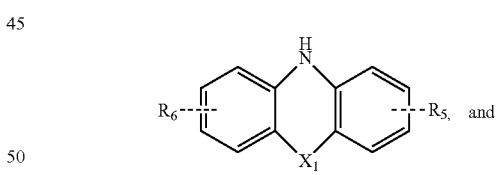

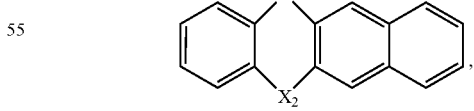, $R_5$ and $R_6$ are each independently selected from one of H, phenyl, and alkyl, $X_1$ is selected from one of absent, single bond, O, S, isopropyl, and $Si(CH_3)_2$, and $X_2$ is selected from one of absent, single bond, O, S, isopropyl, and $Si(CH_3)_2$.

In the manufacturing method, a molar ratio of the organic compound B to the organic compound C ranges from 5:(10 to 13).

In the manufacturing method, the organic compound C is selected from at least one of the following structures:

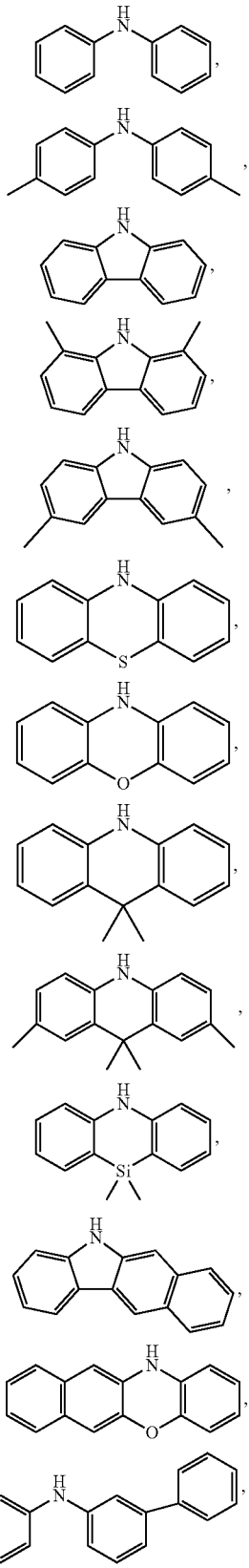

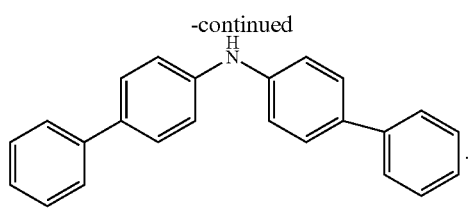

In the manufacturing method, the mixture is reacted at a temperature of 120° C. for 24 h, then cooled, extracted, separated, and purified to obtain the organic compound.

Beneficial Effects

The present application provides an organic compound and a manufacturing method thereof, and an organic light emitting diode electroluminescent device. The organic compound has a suitable HOMO energy level and a high hole mobility. Compared with traditional hole transport materials, when the organic compound is applied in a hole transport layer of the organic light emitting diode electroluminescent device, the organic light emitting diode electroluminescent device has enhanced maximum current efficiency, maximum external quantum efficiency, and service lifespans.

DESCRIPTION OF DRAWINGS

FIG. 1 is a schematic structural diagram of a top-emitting organic light emitting diode electroluminescent device.

DETAILED DESCRIPTION OF PREFERRED EMBODIMENTS

The technical solutions of the present application are hereinafter described in detail with reference to the accompanying drawings. Apparently, the embodiments described below are for the exemplary purpose, without covering all embodiments of the present application. Persons of ordinary skill in the art can derive other embodiments from the embodiments given herein without making any creative effort, and all such embodiments are covered in the protection scope of the present application.

An organic compound comprises a structure represented by a general formula (A) as follows,

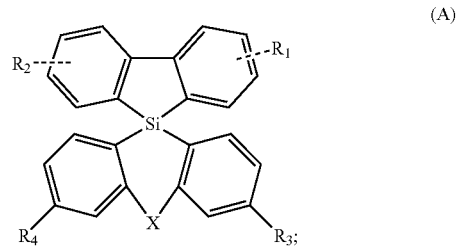

wherein $R_1$ is a first electron-donating group, $R_2$ is a second electron-donating group, H, phenyl, or alkyl, $R_3$ is H or $C(CH_3)_3$, $R_4$ is H or $C(CH_3)_3$, X is O or S, and the first electron-donating group and the second electron-donating group each independently have one of structures as follows,

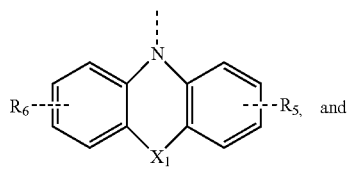

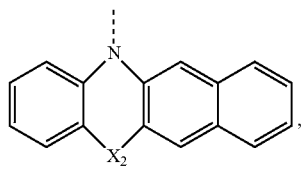

wherein $R_5$ and $R_6$ are each independently selected from one of H, phenyl, and alkyl, $X_1$ is selected from one of absent, single bond, O, S, isopropyl, and $Si(CH_3)_2$, and $X_2$ is selected from one of absent, single bond, O, S, isopropyl, and $Si(CH_3)_2$.

The organic compound of the present application is based on a structure of spirosilafluorene as a core, and is accompanied with a specific electron-donating group, so that the organic compound has a suitable HOMO energy level and LUMO energy level, and has a very high hole transport mobility. The main reason is that, the spirosilafluorene has a strong electron-donating ability. Further, the spirosilafluorene is accompanied with the specific electron-donating group $R_1$ to make the organic compound has a high hole mobility, and by the selection of the electron-donating group $R_1$, the organic compound has a suitable HOMO energy level and LUMO energy level. In addition, compared with the use of spirofluorene as a core, the organic compound of the present application based on the spirosilafluorene as a core can improve the stability of the organic compound. When the organic compound is applied to the organic light emitting diode electroluminescent device, the organic light emitting diode electroluminescent device has an enhanced service lifespan.

In some embodiments, the first electron-donating group and the second electron-donating group each independently have a structure represented by one of formulas as follows, 1
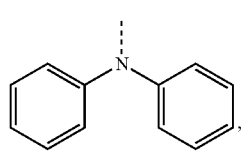

2
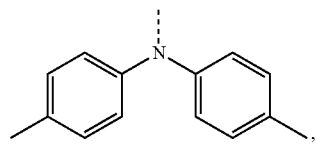

3
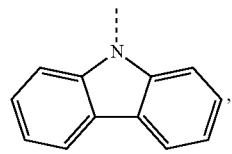

4
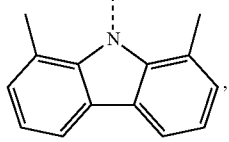

5
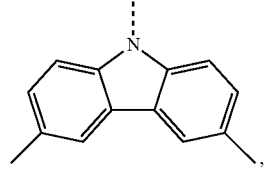

6
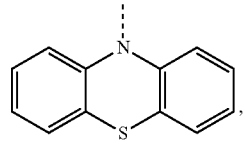

7
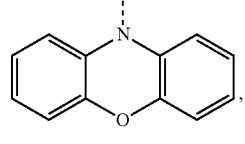

8
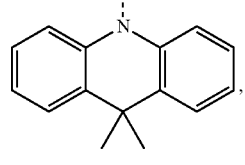

9
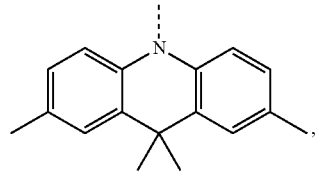

10
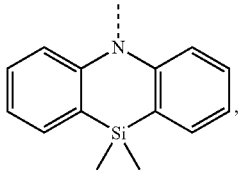

11
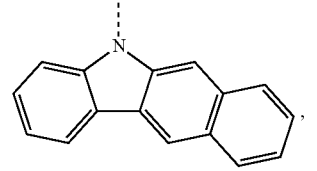

12
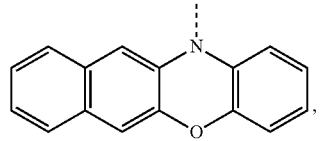

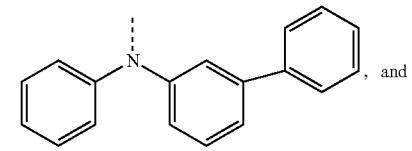, and
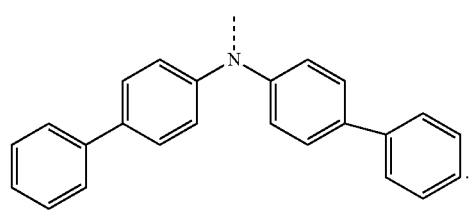
In some embodiments, the organic compound has a structure selected from one of the following structures,
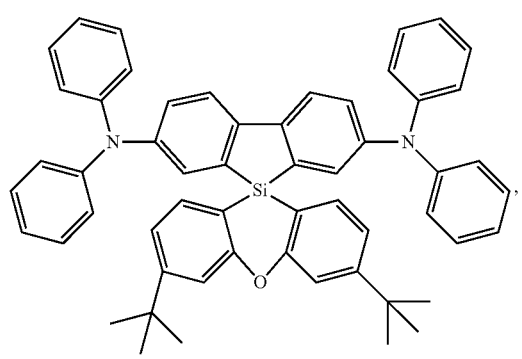
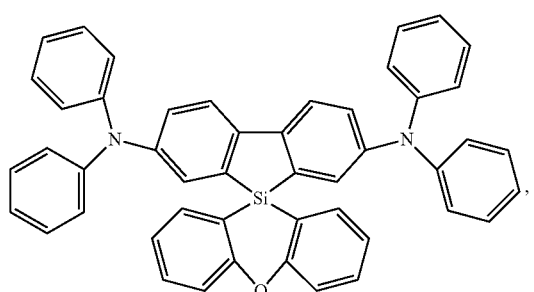
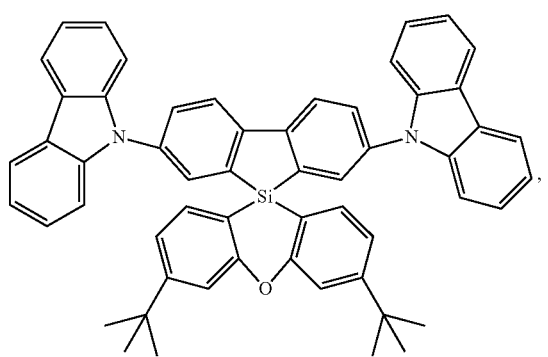
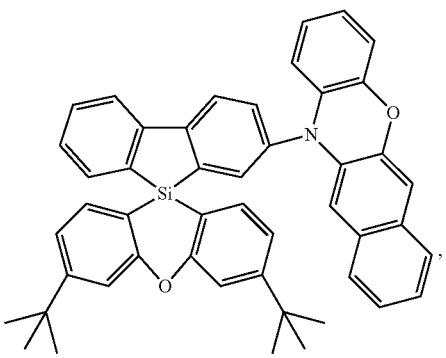
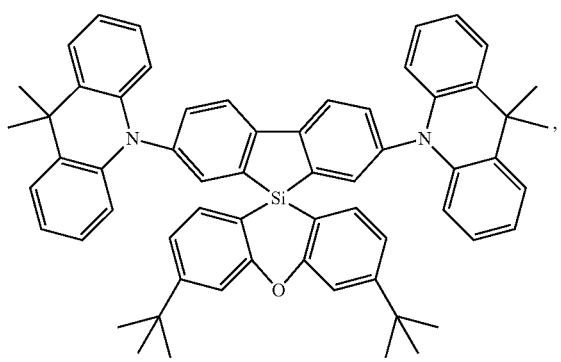
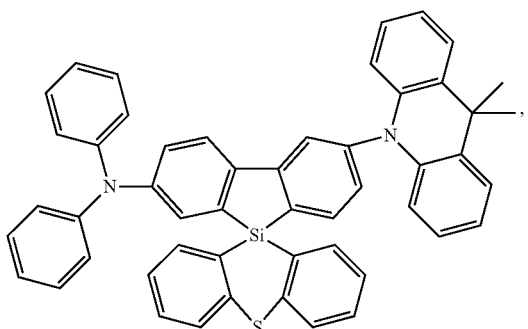
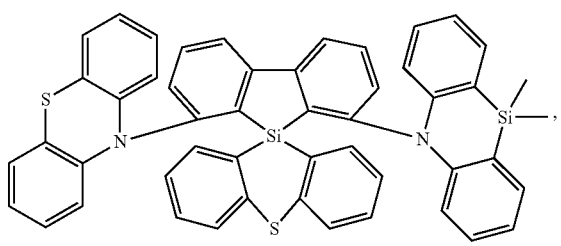
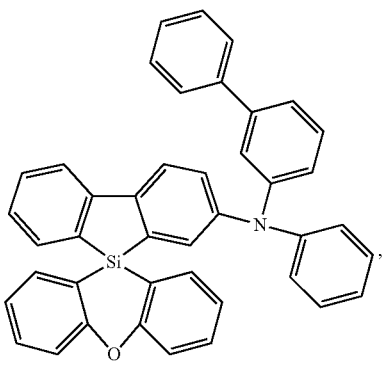

19
-continued

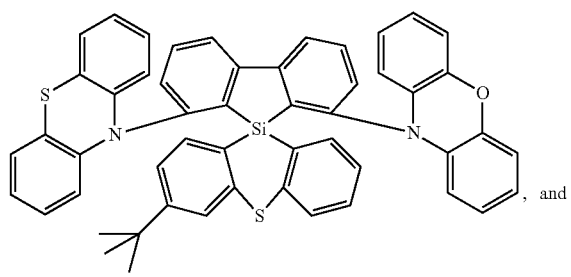
, and

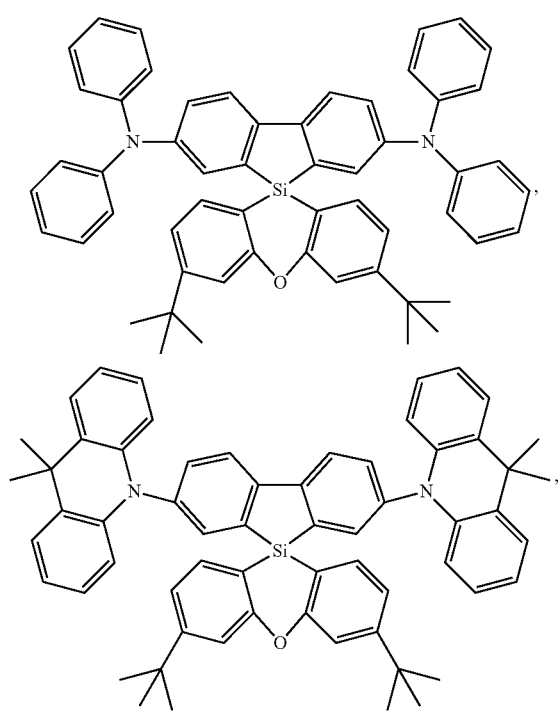

In some embodiments, the $R_3$ and the $R_4$ are tert-butyl, which improves the stability of the organic compound. When the organic compound is applied to the organic light emitting diode electroluminescent device, the organic light emitting diode electroluminescent device has an enhanced service lifespan.

In some embodiments, the organic compound has a structure selected from one of the following structures, 20
-continued

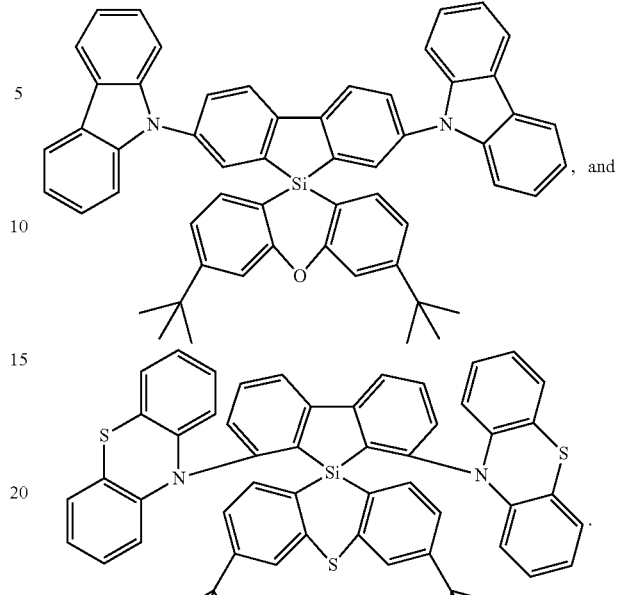

In some embodiments, the X is O.
The above technical solutions will be described below in combination with specific embodiments.

Embodiment 1

In the present embodiment, an organic compound 1 (3,7-bisdiphenylamine-3',7'-di-tert-butylspiro[dibenzosilole-5,10'-dibenzene]) is synthesized according to the following synthetic route:

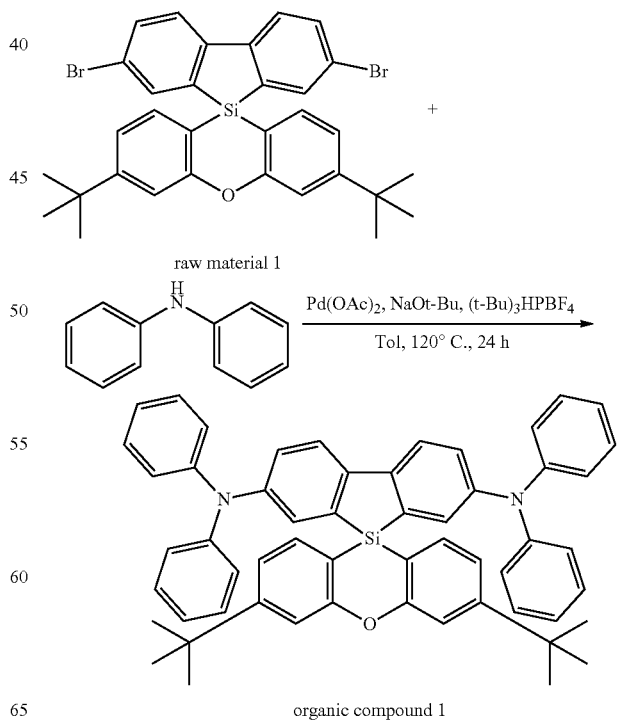

organic compound 1

A manufacturing method of the organic compound 1 comprises steps as follows:

A raw material 1 (3,7-dibromo-3',7'-di-tert-butylspiro[dibenzosilole-5,10'-dibenzene], 3.08 g, 5 mmol), diphenylamine (2.02 g, 12 mmol), palladium acetate (180 mg, 0.8 mmol), and tri-tert-butylphosphine tetrafluoroborate (0.68 g, 2.4 mmol) were added into a 250 mL two-necked flask. Then, in a glove box, NaOt-Bu (1.16 g, 12 mmol) was added, 100 mL of water-removed and oxygen removed toluene was injected into the two-necked flask under argon atmosphere, and reacted at 120° C. for 24 hours. A reaction solution was cooled to room temperature, poured into 200 mL of ice water, extracted three times with dichloromethane, combined with an organic phase, spun to form a silica gel, separated and purified with column chromatography (dichloromethane:n-hexane, v:v, 1:4), so as to obtain 3.1 g of white powder.

Embodiment 2

In the present embodiment, an organic compound 2 (3,7-bisdiphenylamine-spiro[dibenzosilole-5,10'-dibenzene]) is synthesized according to the following synthetic route:

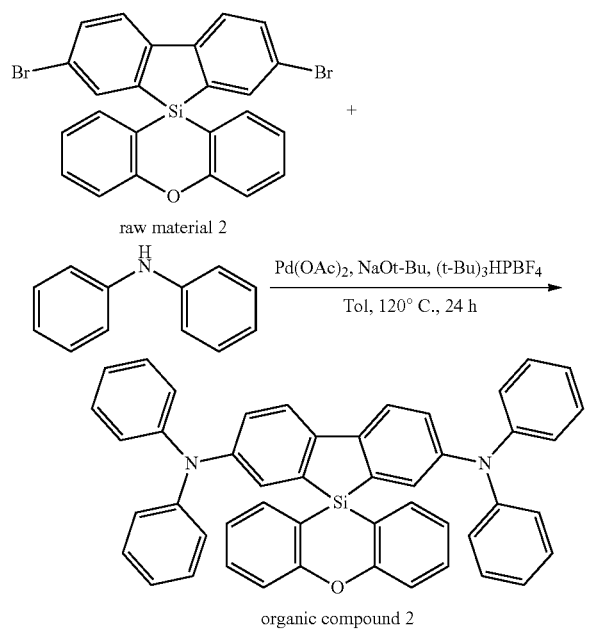

organic compound 2

A manufacturing method of the organic compound 2 comprises steps as follows:

A raw material 2 (3,7-dibromo-spiro[dibenzosilole-5,10'-dibenzene], 2.52 g, 5 mmol), diphenylamine (2.02 g, 12 mmol), palladium acetate (180 mg, 0.8 mmol), and tri-tert-butylphosphine tetrafluoroborate (0.68 g, 2.4 mmol) were added into a 250 mL two-necked flask. Then, in a glove box, NaOt-Bu (1.16 g, 12 mmol) was added, 100 mL of water-removed and oxygen removed toluene was injected into the two-necked flask under argon atmosphere, and reacted at 120° C. for 24 hours. A reaction solution was cooled to room temperature, poured into 200 mL of ice water, extracted three times with dichloromethane, combined with an organic phase, spun to form a silica gel, separated and purified with column chromatography (dichloromethane:n-hexane, v:v, 1:4), so as to obtain 2.8 g of white powder.

Embodiment 3

In the present embodiment, an organic compound 3 (3,7-biscarbazole-3',7'-di-tert-butylspiro[dibenzosilole-5,10'-dibenzene]) is synthesized according to the following synthetic route:

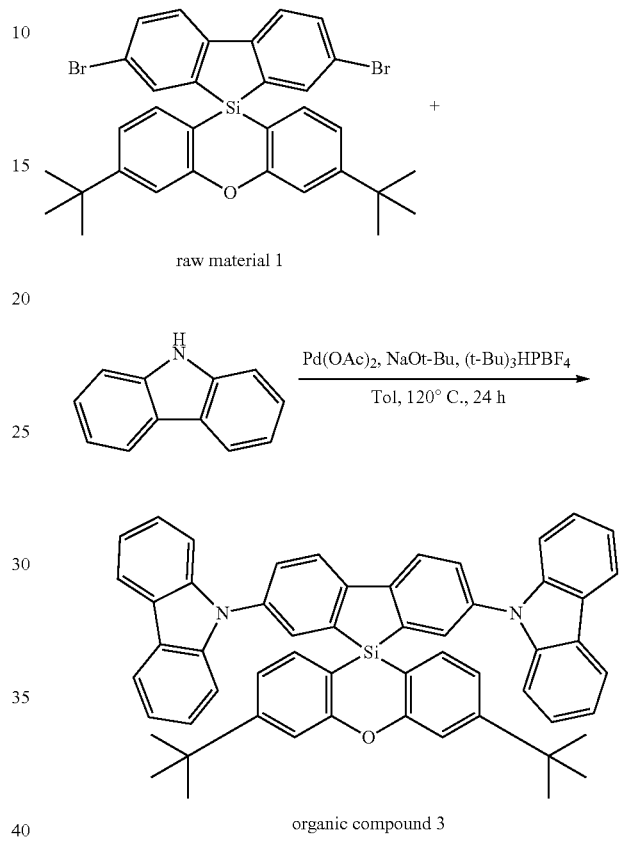

organic compound 3

A manufacturing method of the organic compound 3 comprises steps as follows:

A raw material 1 (3,7-dibromo-3',7'-di-tert-butylspiro[dibenzosilole-5,10'-dibenzene], 3.08 g, 5 mmol), carbazole (2.00 g, 12 mmol), palladium acetate (180 mg, 0.8 mmol), and tri-tert-butylphosphine tetrafluoroborate (0.68 g, 2.4 mmol) were added into a 250 mL two-necked flask. Then, in a glove box, NaOt-Bu (1.16 g, 12 mmol) was added, 100 mL of water-removed and oxygen removed toluene was injected into the two-necked flask under argon atmosphere, and reacted at 120° C. for 24 hours. A reaction solution was cooled to room temperature, poured into 200 mL of ice water, extracted three times with dichloromethane, combined with an organic phase, spun to form a silica gel, separated and purified with column chromatography (dichloromethane:n-hexane, v:v, 1:4), so as to obtain 3.0 g of white powder.

Embodiment 4

In the present embodiment, an organic compound 4 (3,7-bis-9,9'-dimethylacridine-3',7'-di-tert-butylspiro[dibenzosilole-5,10'-dibenz ene]) is synthesized according to the following synthetic route:

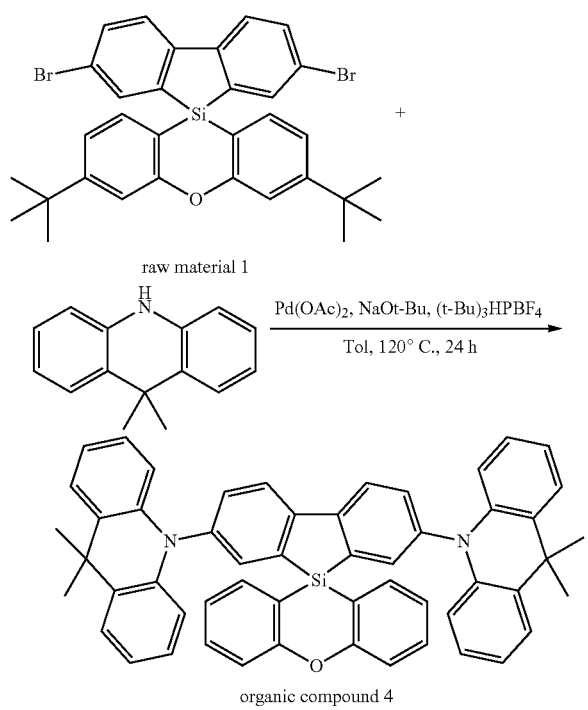

A manufacturing method of the organic compound 4 comprises steps as follows:
A raw material 1 (3,7-dibromo-3',7'-di-tert-butylspiro[dibenzosilole-5,10'-dibenzene], 3.08 g, 5 mmol), 9,9'-dimethylacridine (2.50 g, 12 mmol), palladium acetate (180 mg, 0.8 mmol), and tri-tert-butylphosphine tetrafluoroborate (0.68 g, 2.4 mmol) were added into a 250 mL two-necked flask. Then, in a glove box, NaOt-Bu (1.16 g, 12 mmol) was added, 100 mL of water-removed and oxygen removed toluene was injected into the two-necked flask under argon atmosphere, and reacted at 120° C. for 24 hours. A reaction solution was cooled to room temperature, poured into 200 mL of ice water, extracted three times with dichloromethane, combined with an organic phase, spun to form a silica gel, separated and purified with column chromatography (dichloromethane:n-hexane, v:v, 1:4), so as to obtain 3.4 g of white powder.

Embodiment 5

The organic compound 1, the organic compound 2, the organic compound 3, and the organic compound 4 prepared in Embodiment 1 to Embodiment 4 were subjected to mass spectrometry and electrochemical energy level test. The test results are as shown in Table 1 below.

TABLE 1

Results of mass spectrometry and electrochemical energy level test of the organic compound 1 to 4

|  | organic compound 1 | organic compound 2 | organic compound 3 | organic compound 4 |
|---|---|---|---|---|
| HOMO (ev) | −5.61 | −5.62 | −5.56 | −5.66 |
| LUMO (ev) | −2.69 | −2.69 | −2.69 | −2.69 |
| MS (EI) m/z: [M]+ | 794.37 | 682.14 | 790.34 | 874.43 |

It can be seen from Table 1 that, the molecular weights of the organic compound 1, the organic compound 2, the organic compound 3, and the organic compound 4 analyzed by the mass spectrometry are consistent with their respective standard masses. That is, the organic compound 1, the organic compound 2, the organic compound 3, and the organic compound 4 are all the designed target products. In addition, the LUMO energy levels of the organic compound 1, the organic compound 2, the organic compound 3, and the organic compound 4 are all −2.69 eV. The main reason is that the LUMO energy level is determined by central cores of the organic compounds 1 to 4, and the central cores of the organic compounds 1 to 4 are all the same. That is, all of them are spirosilafluorene. The HOMO energy levels of the organic compound 1 and the organic compound 2 are close, and the main reason is that $R_1$ and $R_2$ are the same. The HOMO energy levels of the organic compound 1, the organic compound 3, and the organic compound 4 are quite different, and the main reason is that a substituent $R_1$ and a substituent $R_2$ are different. The most suitable range of the HOMO energy level of the material for preparing a hole transport layer that matches the material of the traditional hole injection layer (HATCN) is −5.60 to −5.70 eV. The HOMO energy level of the traditional hole transport organic compound (4,4'-bis(N-carbazolyl)biphenyl, CBP) is −6.0, and the traditional hole transport organic compound (CBP) deviates from the most suitable range by more than 0.3 eV. The organic compound 1, the organic compound 2, and the organic compound 4 of the present application are all within the most suitable range, and the organic compound 3 deviated from the optimal range by only 0.004 eV. Thus, the organic compounds 1 to 4 of the present application have suitable HOMO energy levels. In addition, the organic compounds of the present application also have suitable LUMO energy levels.

Embodiment 6

In the present embodiment, the organic compound 1, the organic compound 2, the organic compound 3, the organic compound 4, and the traditional hole transport material (CBP) are respectively applied to top-emitting organic light emitting diode electroluminescent devices, so as to respectively prepare an organic light emitting diode electroluminescent device 1, an organic light emitting diode electroluminescent device 2, an organic light emitting diode electroluminescent device 3, an organic light emitting diode electroluminescent device 4, and an organic light emitting diode electroluminescent device 5. The schematic structural diagram of the top-emitting organic light emitting diode electroluminescent device is as shown in FIG. 1. From the bottom to the top, the top-emitting organic light emitting diode electroluminescent device sequentially comprises an anode 1, a hole injection layer 2, a hole transport layer 3, an electron blocking layer 4, an organic light emitting layer 5, a hole blocking layer 6, an electron transport layer 7, an electron injection layer 8, a cathode 9, and an optical coupling output layer 10. The composition and the thickness of the top-emitting organic light emitting diode electroluminescent device are as shown in Table 2 below.

TABLE 2

The composition and the thickness of the top-emitting organic light emitting diode electroluminescent device

| | Composition | Thickness |
|---|---|---|
| anode | ITO/Ag/ITO | 15 nm/140 nm/15 nm |
| hole injection layer | 2,3,6,7,10,11-hexacyano-1,4,5,8,9,12-hexaazatriphenylene (HATCN) | 100 nm |
| hole transport layer | One of the organic compounds 1 to 4 and CBP | 130 nm |
| electron blocking layer | (4-[1-[4-[bis(4-methylphenyl)amino]phenyl]cyclohexyl]-N-(3-methylphenyl)-N-(4-methylphenyl)aniline (TAPC) | 5 nm |
| organic light emitting layer | 4,4'-bis(9-carbazolyl)biphenyl:tris(2-phenylpyridine)iridium (III) | 36 nm:4 nm |
| hole blocking layer | 3,3'-[5'-[3-(3-pyridyl)phenyl][1,1':3',1''-terphenyl]-3,3''-diyl]dipyridine (TMPyPb) | 15 nm |
| electron transport layer | 8-hydroxyquinoline-lithium (LiQ):TMPyPb | 15 nm:15 nm |
| electron injection layer | LiF | 1 nm |
| cathode | Mg:Ag | 1 nm:10 nm |
| optical coupling output layer | 4,4',4''-tris(carbazole-9-yl)triphenylamine (TCTA)) | 100 nm |

The organic light emitting diode electroluminescent device 1, the organic light emitting diode electroluminescent device 2, the organic light emitting diode electroluminescent device 3, the organic light emitting diode electroluminescent device 4, and the organic light emitting diode electroluminescent device 5 are respectively subjected to a current-voltage-brightness test and a lifespan test. The test results are as shown in Table 3 below.

TABLE 3

Results of current-voltage-brightness test and lifespan test of the organic light emitting diode electroluminescent devices 1 to 5

| Device | Material for preparing hole transport layer | Maximum current efficiency (cd/A) | (CIEx, CIEy) | Maximum external quantum efficiency (%) | Service lifespan (h) |
|---|---|---|---|---|---|
| organic light emitting diode electroluminescent device 1 | organic compound 1 | 142.3 | (0.24, 0.69) | 43.3% | 300 |
| organic light emitting diode electroluminescent device 2 | organic compound 2 | 141.8 | (0.24, 0.69) | 42.6% | 220 |
| organic light emitting diode electroluminescent device 3 | organic compound 3 | 137.0 | (0.24, 0.69) | 38.9% | 270 |
| organic light emitting diode electroluminescent device 4 | organic compound 4 | 139.2 | (0.24, 0.69) | 40.1% | 230 |
| organic light emitting diode electroluminescent device 5 | CBP | 134.3 | (0.24, 0.69) | 35.8% | 145 |

It can be seen from Table 3 that, compared with the organic light emitting diode electroluminescent device 5 made by the traditional hole transport material (CBP), the organic light emitting diode electroluminescent devices 1 to 4 prepared by the organic compounds 1 to 4 all have enhanced maximum current efficiency, maximum external quantum efficiency, and service lifespans. The HOMO energy level of the organic compound 3 is −5.56 eV, so that the performance of the organic light emitting diode electroluminescent device 3 prepared thereby is slightly lower than the organic light emitting diode electroluminescent device 1, the organic light emitting diode electroluminescent device 2, and the organic light emitting diode electroluminescent device 4. The main reason is that, the most suitable range of the HOMO energy level of the material for preparing the hole transport layer that matches the material of the traditional hole injection layer (HATCN) is −5.60 to −5.70 eV. In addition, in terms of the service lifespan of the organic light emitting diode electroluminescent device, the organic light emitting diode electroluminescent device prepared by the organic compound 1 is compared with the organic light emitting diode electroluminescent device prepared by the organic compound 2. The service lifespan of the organic light emitting diode electroluminescent device prepared by the organic compound 1 is increased by 36.4% due to the introduction of tert-butyl in the central core of the organic compound 1. The organic light emitting diode electroluminescent devices 1 to 4 prepared by the organic compounds 1 to 4 have enhanced maximum current efficiency and maximum external quantum efficiency, indicating that the energy levels and the hole transport performances of the organic compounds 1 to 4 match other film layers in the organic light emitting diode electroluminescent devices, and the carrier recombination efficiency is high.

The above embodiments are merely provided for describing the technical solutions and the core ideas of the present application. It should be understood by persons of ordinary skill in the art that although the present application has been described in detail with reference to the embodiments, modifications can be made to the technical solutions described in the embodiments, or equivalent replacements can be made to some technical features in the technical solutions, as long as such modifications or replacements do not depart from the spirit and scope of the present application.

What is claimed is:

1. An organic compound, comprising a structure represented by a general formula (A) as follows,

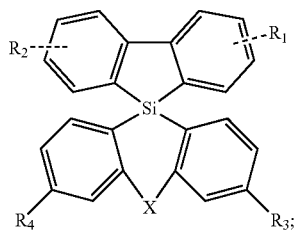

(A)

wherein $R_1$ is a first electron-donating group, $R_2$ is a second electron-donating group, H, phenyl, or alkyl, $R_3$ is H or $C(CH_3)_3$, $R_4$ is H or $C(CH_3)_3$, X is O or S, and the first electron-donating group has one of structures as follows,

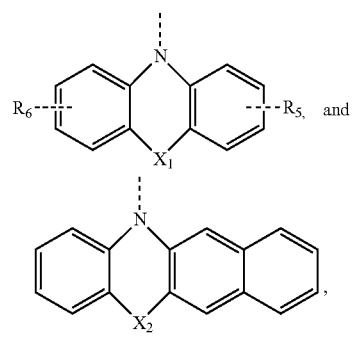

and wherein $R_5$ and $R_6$ are each independently selected from one of H, phenyl, and alkyl, $X_1$ is $Si(CH_3)_2$, and $X_2$ is $Si(CH_3)_2$; and wherein the second electrode-donating group has a structure represented by formula as follows,

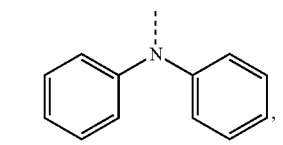
1

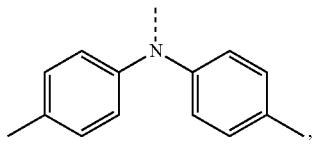
2

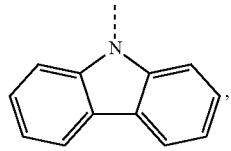
3

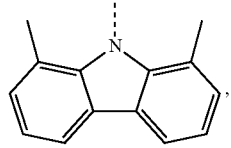
4

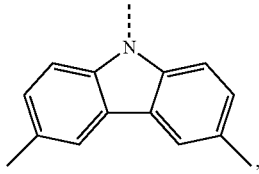
5

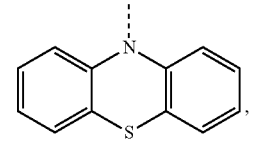
6

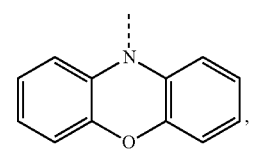
7

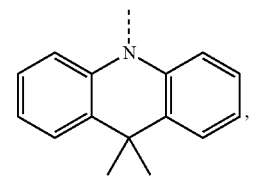
8

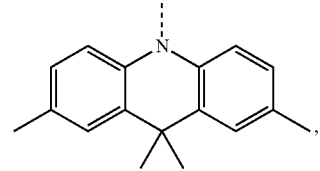
9

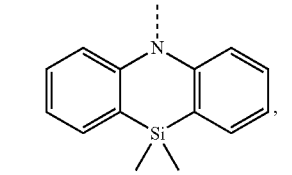
10

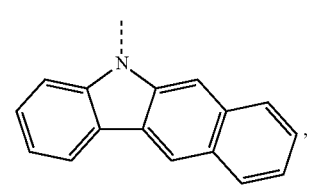
11

-continued

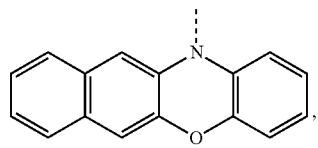, 12

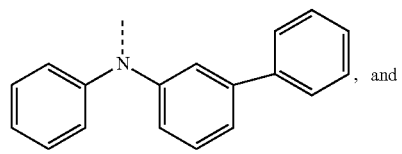, 13 and

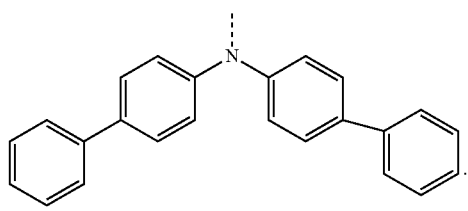. 14

2. The organic compound according to claim 1, wherein the first electron-donating group has a structure represented by formula as follows,

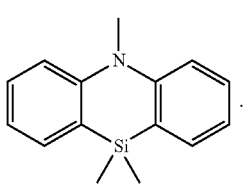. 10

3. The organic compound according to claim 1, wherein the organic compound has a structure selected from the following structure,

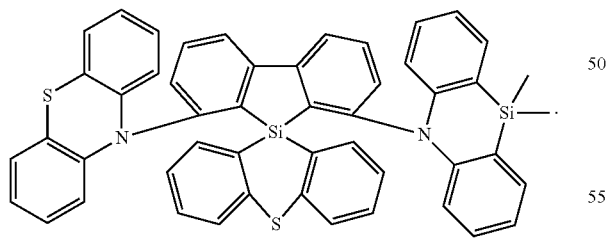.

4. The organic compound according to claim 1, wherein the R$_3$ and the R$_4$ are tert-butyl.

5. The organic compound according to claim 1, wherein the X is O.

6. An organic light emitting diode electroluminescent device, comprising a hole transport layer which comprises an organic compound, wherein the organic compound has a structure represented by a general formula (A) as follows,

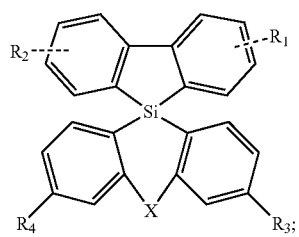 (A)

wherein R$_1$ is a first electron-donating group, R$_2$ is a second electron-donating group, H, phenyl, or alkyl, R$_3$ is H or C(CH$_3$)$_3$, R$_4$ is H or C(CH$_3$)$_3$, X is O or S, and the first electron-donating group has one of structures as follows,

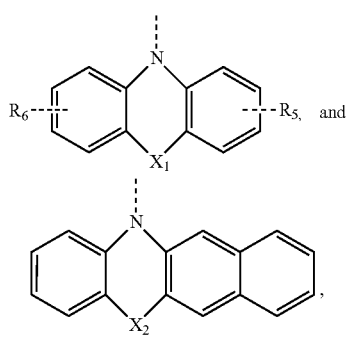 and

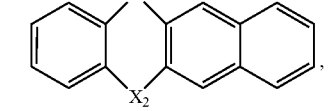, wherein R$_5$ and R$_6$ are each independently selected from one of H, phenyl, and alkyl, X$_1$ is Si(CH$_3$)$_2$, and X$_2$ is Si(CH$_3$)$_2$; and wherein the second electron-donating group has a structure represented by formula as follows,

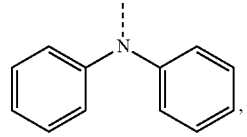, 1

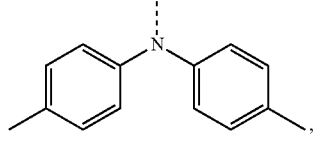, 2

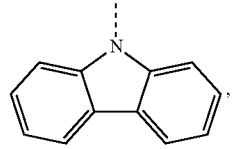, 3

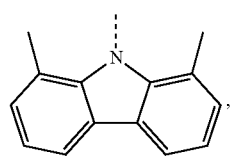, 4

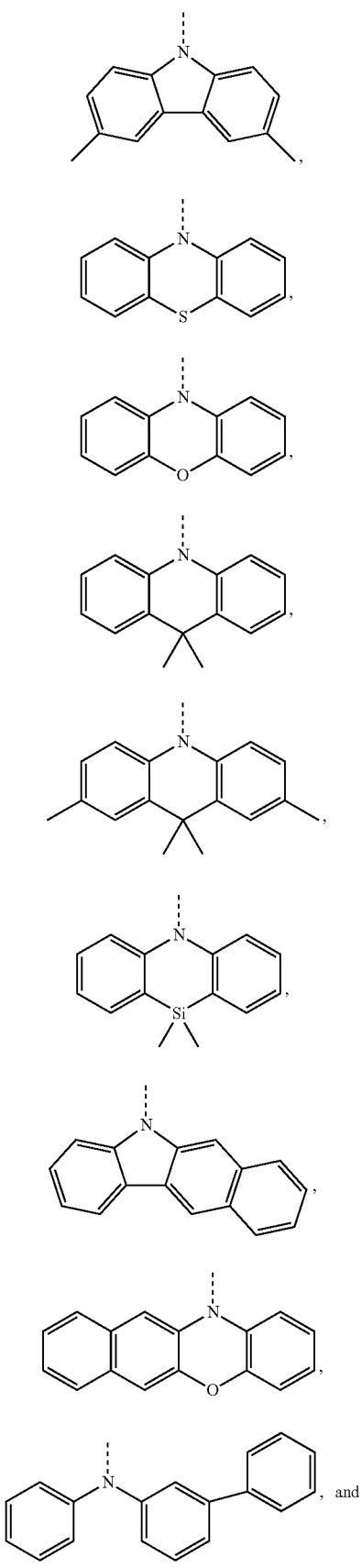

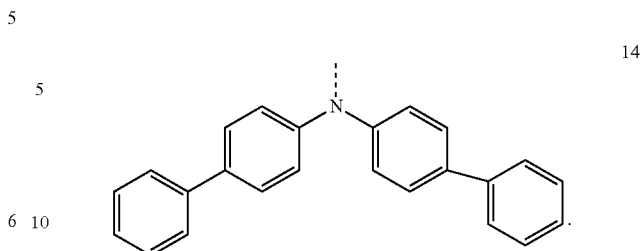

7. The organic light emitting diode electroluminescent device according to claim 6, wherein the first electron-donating group has a structure represented by formula as follows,

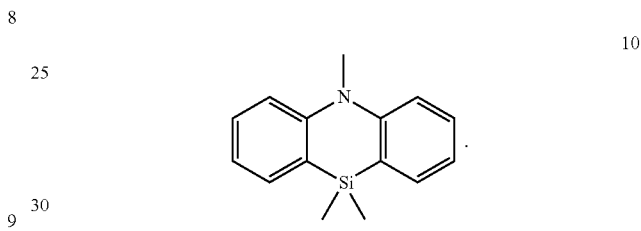

8. The organic light emitting diode electroluminescent device according to claim 6, wherein the organic compound has a structure selected from the following structure,

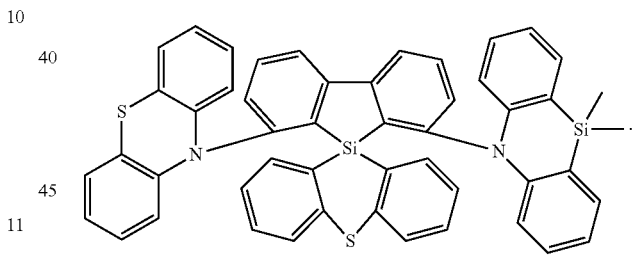

9. The organic light emitting diode electroluminescent device according to claim 6, wherein the $R_3$ and the $R_4$ are tert-butyl.

10. The organic light emitting diode electroluminescent device according to claim 6, wherein the X is O.

11. A manufacturing method of an organic compound, comprising steps of:

adding an organic compound B, an organic compound C, a palladium catalyst, tri-tert-butylphosphine tetrafluoroborate, and alkali into an organic solvent under anhydrous and anaerobic conditions to obtain a mixture;

reacting the mixture at a temperature of 110° C. to 130° C. for 20 h to 28 h, then cooling, extracting, separating, and purifying to obtain the organic compound, wherein a structure of the organic compound B is as follows,

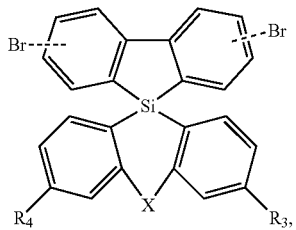

$R_3$ is H or $C(CH_3)_3$, $R_4$ is H or $C(CH_3)_3$, X is O or S, the organic compound C is selected from at least one of the structures shown as follows,

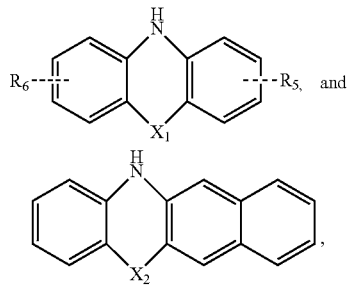

$R_5$ and $R_6$ are each independently selected from one of H, phenyl, and alkyl, $X_1$ is $Si(CH_3)_2$, and $X_2$ is $Si(CH_3)_2$.

12. The manufacturing method of the organic compound according to claim 11, wherein a molar ratio of the organic compound B to the organic compound C ranges from 5:(10 to 13).

13. The manufacturing method of the organic compound according to claim 11, wherein the organic compound C is selected from the following structures:

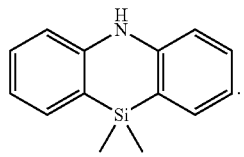 [SMILES: C[Si]1(C)c2ccccc2Nc2ccccc21 ; "."]

14. The manufacturing method of the organic compound according to claim 11, wherein the mixture is reacted at a temperature of 120° C. for 24 h, then cooled, extracted, separated, and purified to obtain the organic compound.

* * * * *